US010847380B2

(12) United States Patent
Li et al.

(10) Patent No.: US 10,847,380 B2
(45) Date of Patent: Nov. 24, 2020

(54) SEMICONDUCTOR DEVICE AND MANUFACTURING METHOD THEREOF

(71) Applicant: Winbond Electronics Corp., Taichung (TW)

(72) Inventors: Shu-Ming Li, Taichung (TW); Tzu-Ming Ou Yang, Taichung (TW); Ko-Po Tseng, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/820,744

(22) Filed: Mar. 17, 2020

(65) Prior Publication Data

US 2020/0219733 A1  Jul. 9, 2020

Related U.S. Application Data

(62) Division of application No. 16/111,243, filed on Aug. 24, 2018, now Pat. No. 10,665,471.

(30) Foreign Application Priority Data

Sep. 20, 2017  (CN) .......................... 2017 1 0853522

(51) Int. Cl.
| H01L 21/3213 | (2006.01) |
| H01L 21/02 | (2006.01) |
| H01L 21/285 | (2006.01) |
| H01L 21/033 | (2006.01) |
| H01L 21/311 | (2006.01) |
| H01L 21/28 | (2006.01) |

(52) U.S. Cl.
CPC .... *H01L 21/32139* (2013.01); *H01L 21/0217* (2013.01); *H01L 21/02164* (2013.01); *H01L 21/02274* (2013.01); *H01L 21/0332* (2013.01); *H01L 21/0337* (2013.01); *H01L 21/28568* (2013.01); *H01L 21/31116* (2013.01); *H01L 21/32135* (2013.01); *H01L 21/32136* (2013.01); *H01L 29/40114* (2019.08)

(58) Field of Classification Search
CPC .......... H01L 21/32139; H01L 21/0332; H01L 21/31116; H01L 21/32135; H01L 21/0217; H01L 21/02164; H01L 21/32136; H01L 21/0337; H01L 21/02274; H01L 21/31144
See application file for complete search history.

(56) References Cited

U.S. PATENT DOCUMENTS

2016/0005656 A1\*  1/2016  Ching ............... H01L 21/02532
                                                             438/283
2016/0359020 A1\*  12/2016  Choi ................. H01L 29/66795
(Continued)

*Primary Examiner* — Thanh Y. Tran
(74) *Attorney, Agent, or Firm* — JCIPRNET

(57) ABSTRACT

A semiconductor device is provided. The semiconductor device includes a core structure, a first pattern and a second pattern. The core structure is disposed on a substrate. The first pattern covers a sidewall of a bottom portion of the core structure. The top surface of the first pattern is lower than a top surface of the core structure. The second pattern is disposed on the first pattern and covering a top portion of the core structure. A sidewall of the top portion of the core structure and the top surface of the core structure are covered by the second pattern. The second pattern has an upper portion tapered away from the substrate. A material of the first pattern is different from a material of the second pattern.

11 Claims, 6 Drawing Sheets

10

(56) References Cited

U.S. PATENT DOCUMENTS

| | | | |
|---|---|---|---|
| 2017/0352744 A1* | 12/2017 | Basker | H01L 27/0886 |
| 2019/0164836 A1* | 5/2019 | Ghani | H01L 21/28568 |
| 2019/0288084 A1* | 9/2019 | Wang | H01L 21/32135 |

* cited by examiner

SEMICONDUCTOR DEVICE AND MANUFACTURING METHOD THEREOF

CROSS-REFERENCE TO RELATED APPLICATION

This application is a divisional application of and claims the priority benefit of U.S. application Ser. No. 16/111,243, filed on Aug. 24, 2018, which claims the priority benefit of China application serial no. 201710853522.X, filed on Sep. 20, 2017. The entirety of each of the above-mentioned patent applications is hereby incorporated by reference herein and made a part of this specification.

BACKGROUND OF THE INVENTION

Field of the Invention

The invention relates to a semiconductor device and a manufacturing method thereof.

Description of Related Art

A method of self aligned double patterning (SADP) includes forming a mask material layer on a surface of a core structure and performing anisotropic etching on the mask material layer in different chambers, so as to form a mask pattern on a sidewall of the core structure. In general, the mask pattern would not cover a top surface of the core structure, and two different chambers are needed to form the mask pattern.

SUMMARY OF THE INVENTION

The manufacturing method of a semiconductor device of the invention includes the following steps. A core structure is formed on a substrate. A first material layer is formed on the substrate. A top surface of the first material layer is lower than a top surface of the core structure. A second pattern is formed on an exposed surface of the core structure. The method of forming the second pattern includes forming a second material layer on the exposed surface of the core structure and a surface of the first material layer and performing an anisotropic etching on the second material layer. The first material layer is patterned by using the second pattern as a mask to form a first pattern. The step of forming the second material layer and the step of performing anisotropic etching on the second material layer are performed in the same etching chamber.

In an embodiment of the invention, a power used in the step of forming the second material layer can be ranged from 300 W to 1500 W, and an operating pressure range thereof can be ranged from 4 mTorr to 50 mTorr.

In an embodiment of the invention, a method of forming the second material layer can include introducing a deposition gas into the etching chamber, and a method of performing the anisotropic etching on the second material layer can include introducing an etching gas into the etching chamber.

In an embodiment of the invention, the methods of forming the second material layer and performing the anisotropic etching on the second material layer can include introducing a deposition gas and an etching gas into the etching chamber alternately.

In an embodiment of the invention, the method of forming the second material layer and performing the anisotropic etching on the second material layer can include introducing a deposition gas and an etching gas into the etching chamber together.

In an embodiment of the invention, the method of forming the first material layer can include forming a material layer on the substrate and then removing a portion of the material layer via an etch-back method to form the first material layer. The step of removing the portion of the material layer can be performed in the etching chamber.

In an embodiment of the invention, a method of patterning the first material layer by using the second pattern as a mask can include an anisotropic etching, which can be performed in the etching chamber.

In an embodiment of the invention, a first thickness of the second material layer on the top surface of the core structure can be greater than a second thickness of the second material layer on the top surface of the first material layer.

In an embodiment of the invention, a ratio of the first thickness with respect to the second thickness can be ranged from 3 to 20.

In an embodiment of the invention, the second pattern covers a sidewall and a top surface of the core structure exposed by the first pattern, and the second pattern has a top portion with a tapered shape.

A semiconductor device includes a core structure, a first pattern, and a second pattern. The core structure is disposed on a substrate. The first pattern is disposed on a sidewall of the core structure. A top surface of the first pattern is lower than a top surface of the core structure. The second pattern covers the sidewall and top surface of the core structure exposed by the first pattern. The second pattern has a top portion with a tapered shape and the material of the first pattern is different from the material of the second pattern.

In an embodiment of the invention, the sidewall of the top portion of the second pattern can be an inclined plane or a curved plane.

In an embodiment of the invention, a sidewall of the second pattern can be coplanar with a sidewall of the first pattern.

Based on the above, the second material layer is formed in the etching chamber such that the thickness of the second material layer on the top surface of the core structure is greater than the thickness of the second material on the first material layer. As a result, the second pattern formed by patterning the second material can still cover the top surface of the core structure. Therefore, during the etching process on the second material layer, damage to the core structure as a result of plasma can be avoided. In particular, the second pattern is formed to have a top portion with a tapered shape. Moreover, the step of forming the second material layer and the step of performing the anisotropic etching on the second material layer can be performed in the same etching chamber. Therefore, the operation of wafer transfer between different chambers can be omitted. That is, the process time of the semiconductor device can be shortened.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
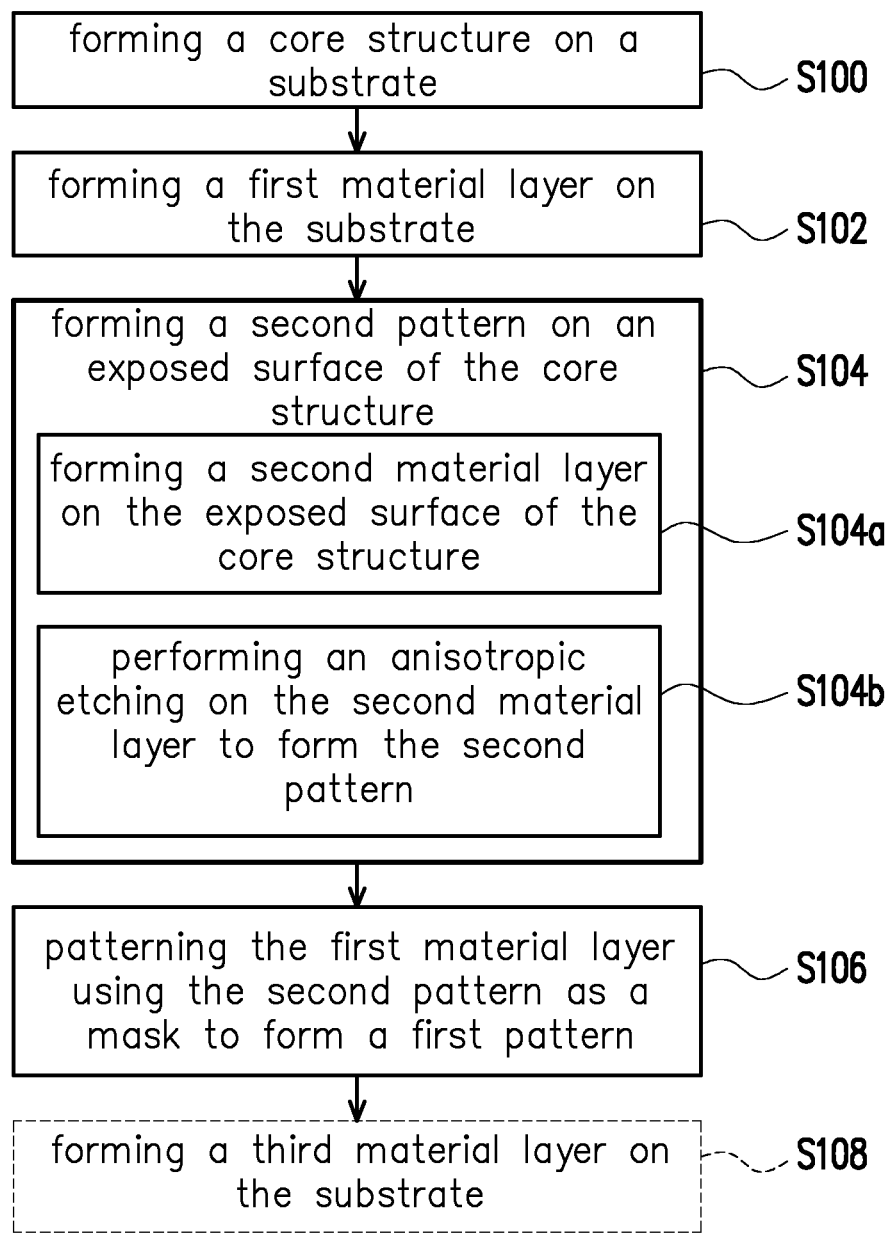
FIG. 1 is a flow chart of a manufacturing method of a semiconductor device according to an embodiment of the invention.

FIG. 1 is a flow chart of a manufacturing method of a semiconductor device according to an embodiment of the invention. FIG. 2 to FIG. 8 are cross-sectional views of a manufacturing process of a semiconductor device according to an embodiment of the invention. The manufacturing method of a semiconductor device 10 of the present embodiment (as shown in FIG. 8) includes the following steps.

Figure 2:
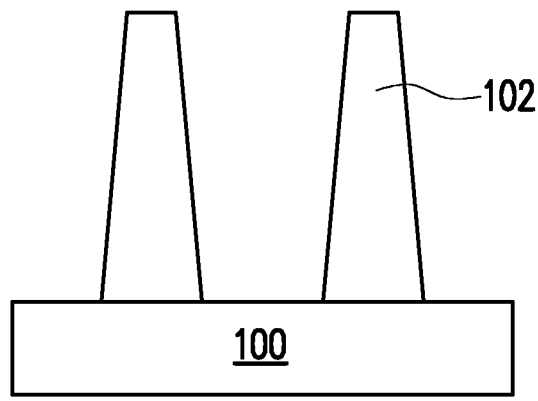
FIG. 2 to FIG. 8 are cross-sectional views of a manufacturing process of a semiconductor device according to an embodiment of the invention.

Referring to FIG. 1 and FIG. 2, step S100 is performed to form a core structure 102 on a substrate 100. In some embodiments, the substrate 100 can include a semiconductor substrate or a silicon-on-insulator (SOI) substrate. For instance, a material of the semiconductor substrate can include a doped or undoped semiconductor material such as silicon, germanium, gallium arsenide, silicon carbide, indium arsenide, or indium phosphide. Moreover, the substrate 100 can be formed to include an active device and/or a passive device. The active device can include a transistor, a diode or the like. The passive device can include a resistor, capacitor, inductor or the like. In some embodiments, the core structure 102 can be an insulation structure. The insulation structure includes at least one insulating layer. A material of the at least one insulating layer can include silicon oxide, silicon nitride, or a combination thereof. In other embodiments, the core structure 102 can be a gate structure. For instance, the gate structure can include a gate dielectric layer, a work function layer, a gate layer, and a spacer. Moreover, the gate layer can include a floating gate and a control gate, and the gate structure can further include an inter-gate dielectric layer located between the floating gate and the control gate.

Figure 3:
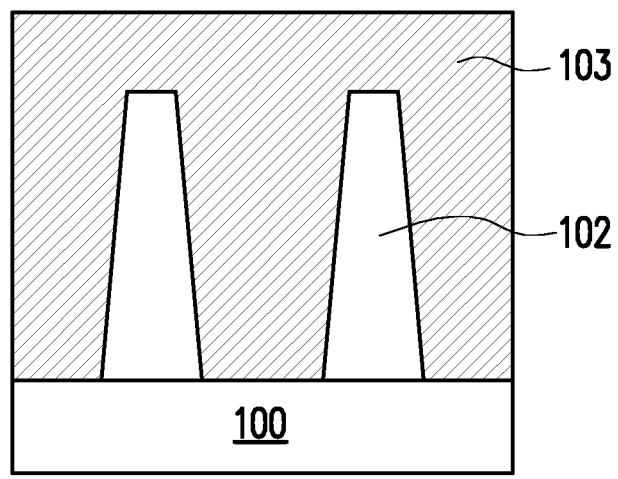
Figure 4:
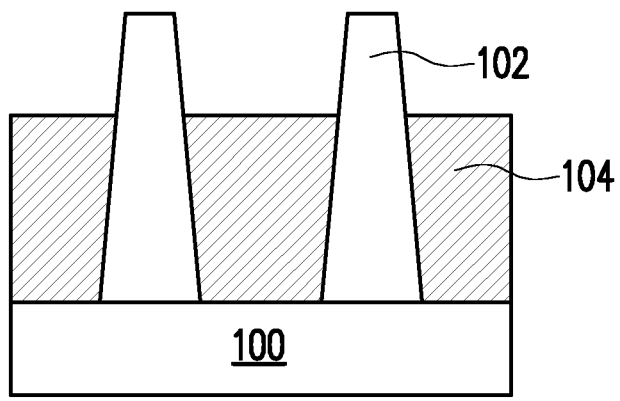

Referring FIG. 1, FIG. 3, and FIG. 4, step S102 is performed to form a first material layer 104 on the substrate 100. The first material layer 104 is formed such that a top surface thereof is lower than a top surface of the core structure 102. A material of the first material layer 104 can include polysilicon, metal, or a metal compound. The metal can include aluminum, copper, tungsten, titanium, tantalum, or a combination thereof. The metal compound can include metal nitride such as titanium nitride, tantalum nitride, or tungsten nitride. Referring to FIG. 3, a method of forming the first material layer 104 includes first forming a material layer 103 on the substrate 100. Referring to FIG. 4, a portion of the material layer 103 is then removed by an etch-back method to form the first material layer 104.

Figure 5:
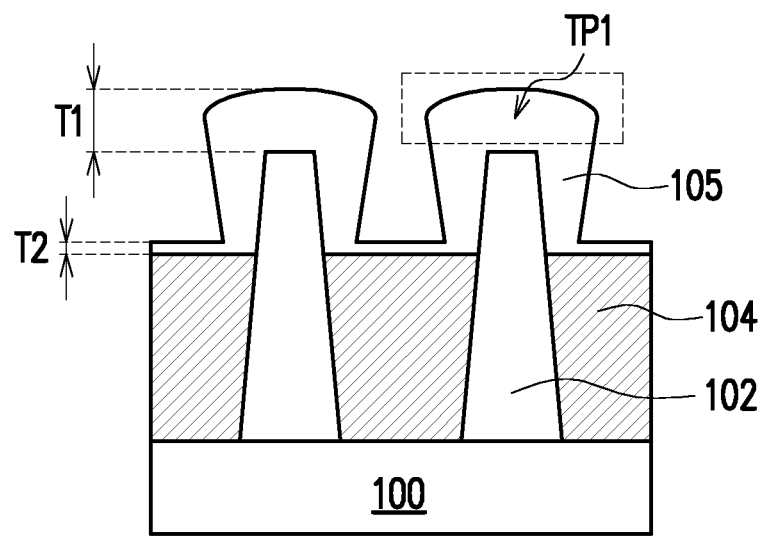
Figure 6:
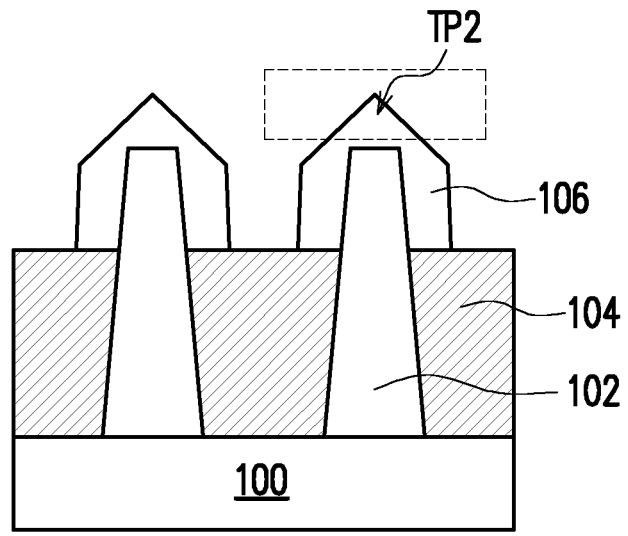

Referring FIG. 1, FIG. 5, and FIG. 6, a step S104 is performed to form a second pattern 106 on an exposed surface of the core structure 102. The step S104 includes a sub-step S104a and a sub-step S104b as described below.

Referring to FIG. 1 and FIG. 5, the sub-step S104a is performed to form a second material layer 105 on the exposed surface of the core structure 102 and a surface of the first material layer 104. A material of the second material layer 105 can be different from the material of the first material layer 104. In some embodiments, the material of the second material layer 105 can include an insulating material. The insulating material can include an inorganic insulating material or an organic insulating material. For instance, the inorganic insulating material can include silicon oxide, silicon nitride, or a combination thereof. The organic insulating material can include an organic hydrocarbon compound, a carbohydrate compound, nitrogen, sulfur, halogen, or a combination thereof. A method for forming the second material layer 105 includes a chemical vapor deposition method. It should be mentioned that, the method of forming the second material layer 105 of the present embodiment includes introducing a deposition gas into an etching chamber to perform the chemical vapor deposition process. For instance, the deposition gas can include an organic hydrocarbon compound, carbohydrate compound, chloride, fluoride, silicon organic compound, silicon chloride compound, silicon fluoride compound, silicon nitride compound, oxygen, ozone, argon, helium, nitrogen, carbon monoxide, methane, or a combination thereof. In comparison to a deposition chamber, an etching chamber has a higher power and a lower operating pressure. For instance, the power used in the step of forming the second material layer 105 (sub-step 104a) can be ranged from 300 W to 1500 W, and the operating pressure in the same step can be ranged from 4 mTorr to 50 mTorr. As a result, a first thickness T1 of the resulting second material layer 105 on the top surface of the core structure 102 can be greater than a second thickness T2 of the resulting second material layer 105 on the surface of the first material layer 104. In some embodiments, a ratio of the first thickness T1 with respect to the second thickness T2 can be ranged from 3 to 20. Moreover, in some embodiments, an area of an upper surface of a top portion TP1 (shown as a region enclosed by a dotted line in FIG. 5) of the resulting second material layer 105 on the core structure 102 can be greater than an area of a lower surface thereof. In other words, a cross-section of the top portion TP1 of the second material layer 105 can be similar to a trapezoid, and a top base of the trapezoid is longer than a bottom base thereof.

Referring to FIG. 1 and FIG. 6, the sub-step S104b is performed to perform an anisotropic etching on the second material layer 105 to form the second pattern 106. A method of performing the sub-step S104b includes introducing an etching gas into the etching chamber to perform the anisotropic etching process. In particular, the sub-step S104a and the sub-step S104b are performed in the same etching chamber. Therefore, an operation of wafer transfer between different chambers can be omitted. That is, a process time can be reduced. In the sub-step S104b, the etching gas can include carbon tetrafluoride, trifluoromethane, difluoromethane, oxygen, argon, nitrogen, chlorine, hydrogen bromide, carbon monoxide, sulfur hexafluoride, nitrogen trifluoride, octafluorocyclobutane, octafluorocyclopentene, hexafluoro-2-butyne, or a combination thereof. In some embodiments, a power of performing the anisotropic etching on the second material layer 105 (in the sub-step S104b) can be greater than the power of forming the second material layer (in the sub-step S104a). Moreover, an operating pressure of performing the anisotropic etching on the second material layer 105 (in the sub-step S104b) can be less than the operating pressure of forming the second material layer (in the sub-step S104a). For instance, the power of performing the anisotropic etching on the second material layer 105 can be ranged from 300 W to 2000 W, and the operating pressure thereof can be ranged from 5 mTorr to 100 mTorr. As a result, in the sub-step S104b, a portion of the second material layer 105 covering the surface of the first material layer 104 is removed, and the remaining portion is partially removed to form the second pattern 106. Since the first thickness T1 of the second material layer 105 on the top surface of the core structure 102 can be greater than the second thickness T2 thereof on the surface of the first material layer 104, the second material layer 105 can still cover the top surface of the core structure 102 after forming the resulting second pattern 106 by patterning. In particular, the second pattern 106 covers a sidewall and the top surface of the core structure 102 exposed by the first material layer 104. In other words, during the etching process on the second material layer 105, damages on the core structure 102 caused by plasma can be avoided. Moreover, the second pattern 106 is formed to have a top portion TP2 with a tapered shape. In some embodiments, the sidewall of the top portion TP2 of the second pattern 106 is an inclined plane.

Figure 6A:
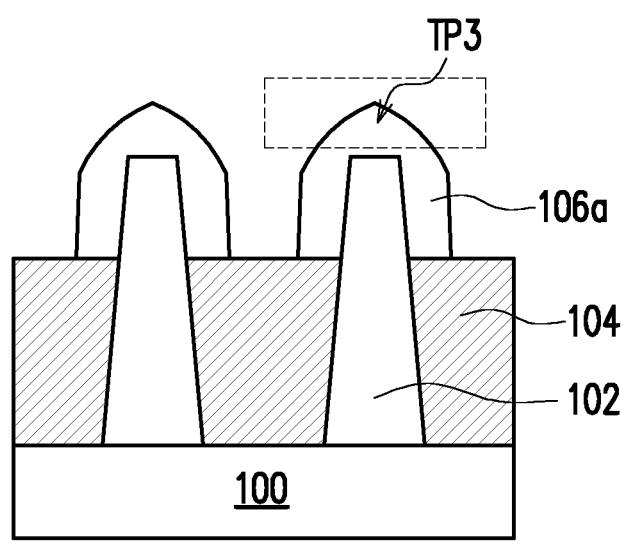
FIG. 6A is a cross-sectional view of a second pattern shown according to another embodiment of the invention.

FIG. 6A is a cross-sectional view of a second pattern shown according to another embodiment of the invention. Referring to FIG. 6A, in this embodiment, a sidewall of a top portion TP3 of the second pattern 106a can otherwise be formed into a curved plane. Moreover, the same components in FIG. 6A and FIG. 6 are labeled with the same reference numerals and are not repeated herein.

Referring further to FIG. 1, FIG. 5, and FIG. 6, in some embodiments, the method of forming the second material layer 105 and performing the anisotropic etching on the second material layer 105 to form the second pattern 106 includes alternately introducing a deposition gas and an etching gas into the same etching chamber. In other words, the sub-step S104a and the sub-step S104b can be alternately performed in the same etching chamber. In these embodiments, the sub-step S104a is performed first, and the method of forming the second pattern 106 is completed at the sub-step S104b. Moreover, those having ordinary skill in the art can adjust the number of repetitions of the sub-step S104a and the sub-step S104b based on process needs, and the invention is not limited thereto. In other embodiments, a method of forming the second material layer 105 and performing the anisotropic etching on the second material layer 105 to form the second pattern 106 includes introducing a deposition gas and an etching gas into the same etching chamber together. In other words, in these embodiments, the sub-step S104a and the sub-step S104b can be performed together in the same etching chamber.

Figure 6B:
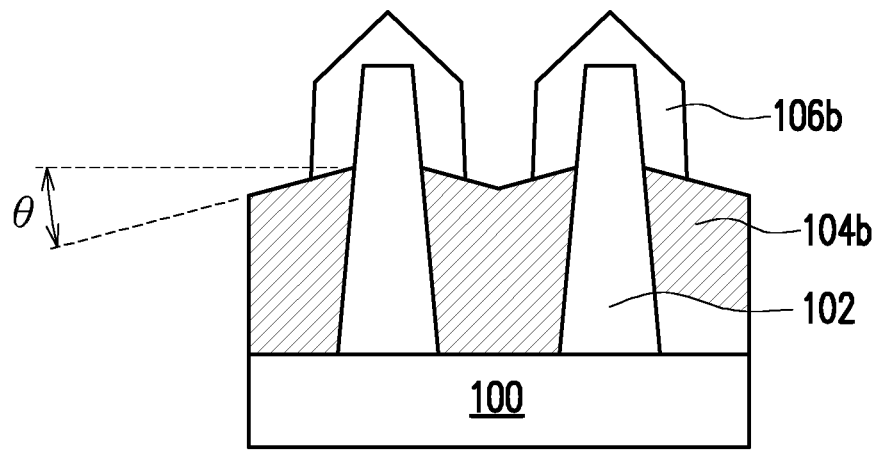
FIG. 6B is a cross-sectional view of a second pattern and a first material layer shown according to yet another embodiment of the invention.

FIG. 6B is a cross-sectional view of a second pattern and a first material layer shown according to yet another embodiment of the invention. Referring to FIG. 6B, in some other embodiments, removal of a portion of the first material layer 104b can be accompanied with the procedure of forming the second pattern 106b, such that the first material 104b has a substantially V-shaped surface. As a result, an interface between the second pattern 106b and the first material layer 104b can be formed into an inclined plane. In particular, an angle θ between an extending direction of the interface between the second pattern 106b and the first material layer 104b with respect to an extending direction of a surface of the substrate 100 can be in the range of 20° to 35°. Moreover, the same components in FIG. 6B and FIG. 6 are labeled with the same reference numerals and are not repeated herein.

Figure 7:
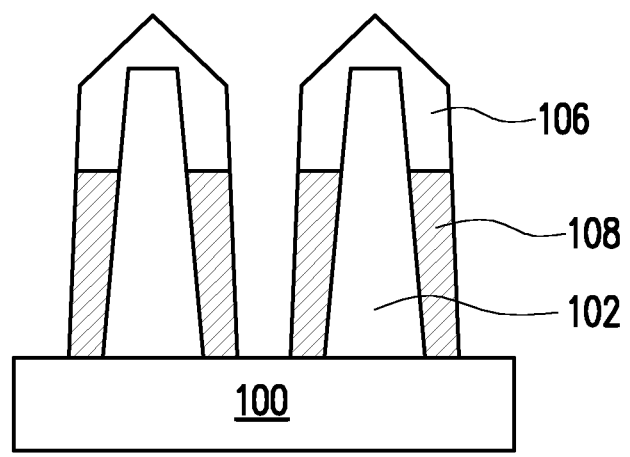
Figure 8:
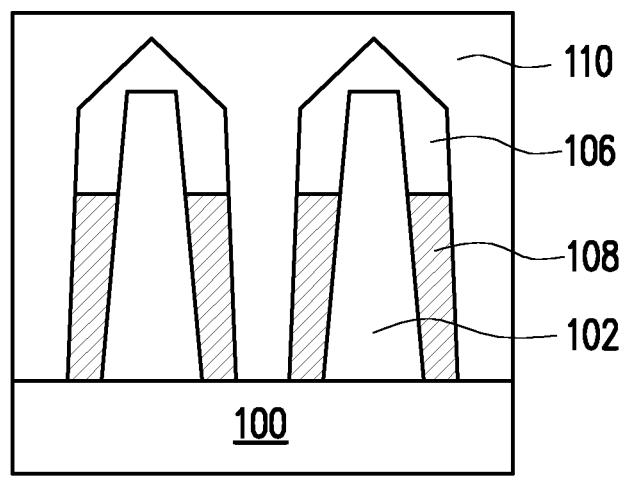

Referring to FIG. 1 and FIG. 7, a step S106 is performed to pattern the first material layer 104 using the second pattern 106 as a mask to form the first pattern 108. A method of patterning the first material layer 104 can include an anisotropic etching. Moreover, a sidewall of the first pattern 108 can be formed to be coplanar with the sidewall of the second pattern 106. In some embodiments, the etching chamber used in the step S102, the step S104, and the step S106 can be the same etching chamber. As a result, the material layer 103, the second material layer 105, and the first material layer 104 can be respectively etched by merely selecting different etching gases according to different etching targets. In other embodiments, at least one of the etching chamber used in the step S102, the etching chamber used in the step S104, and the etching chamber used in the step S106 can be different from the others.

Referring to FIG. 1 and FIG. 8, step S108 is optionally performed to form a third material layer 110 on the substrate 100. The third material layer 110 is formed to cover the substrate 100, the second pattern 106, and the first pattern 108. A material of the third material layer 110, the material of the first pattern 108, and the material of the second pattern 106 can be different from one another. The material of the third material layer 110 can include silicon oxide, silicon nitride, or a combination thereof. At this point, the manufacture of the semiconductor device 10 of the present embodiment is complete.

Next, the structure of the semiconductor device 10 of the present embodiment is described with FIG. 8.

Referring to FIG. 8, the semiconductor device 10 includes a core structure 102, a first pattern 108, and a second pattern 106. The core structure 102 is disposed on the substrate 100. The first pattern 108 is disposed on a sidewall of the core structure 102. A top surface of the first pattern 108 is lower than a top surface of the core structure 102. The second pattern 106 covers the sidewall and a top surface of the core structure 102 exposed by the first pattern 108. The second pattern 106 has a top portion TP2 with a tapered shape. A material of the first pattern 108 is different from A material of the second pattern 106. Moreover, a sidewall of the second pattern 106 can be coplanar with a sidewall of the first pattern 108. The semiconductor device 10 can further include a third material layer 110. The third material layer 110 covers the substrate 100, the second pattern 106, and the first pattern 108.

In some embodiments, a sidewall of the top portion TP2 of the second pattern 108 is an inclined plane. In other embodiments (refer to FIG. 6A), a sidewall of a top portion TP3 of a second pattern 108a can also be an curved plane. Moreover, in some embodiments (refer to FIG. 6B), an interface between the second pattern 106b and the first material layer 104b can be an inclined plane. The angle θ of an extending direction of this inclined plane with respect to a surface of the substrate 100 can be in the range of 20° to 35°.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:
1. A semiconductor device, comprising:
a core structure disposed on a substrate;
a first pattern covering a sidewall of a bottom portion of the core structure, wherein a top surface of the first pattern is lower than a top surface of the core structure; and
a second pattern disposed on the first pattern and covering a top portion of the core structure, wherein a sidewall of the top portion of the core structure and the top surface of the core structure are covered by the second pattern, wherein the second pattern has an upper portion tapered away from the substrate, wherein a material of the first pattern is different from a material of the second pattern, and wherein a lateral thickness of a lower portion of the second pattern spanning from a bottommost end of the upper portion to a bottommost surface of the second pattern maintains constant or gradually varies from a topmost end to a bottommost end of the lower portion, and the lateral thickness is measured from the sidewall of the top portion of the core structure to a sidewall of the lower portion of the second pattern.

2. The semiconductor device of claim 1, wherein a sidewall of the upper portion of the second pattern is an inclined plane.

3. The semiconductor device of claim 1, wherein a sidewall of the upper portion of the second pattern is a curved plane.

4. The semiconductor device of claim 1, wherein a portion of the second pattern covering a top corner of the core structure has a thickness less than a thickness of a portion of the second pattern covering the top surface of the core structure, and less than the lateral thickness of the lower portion of the second pattern covering the sidewall of the core structure.

5. The semiconductor device of claim 1, wherein the second pattern is non-conformally covering the top portion of the core structure.

6. The semiconductor device of claim 1, wherein a sidewall of the lower portion of the second pattern is coplanar with an outer surface of the first pattern.

7. The semiconductor device of claim 1, wherein the first pattern is extending to a bottom surface of the second pattern from the substrate along the sidewall of the bottom portion of the core structure.

8. The semiconductor device of claim 1, wherein an interface between the first pattern and the second pattern is parallel to a top surface of the substrate.

9. The semiconductor device of claim 1, wherein the core structure and the substrate are formed of different materials.

10. A semiconductor device, comprising:
   a core structure disposed on a substrate;
   a first pattern covering a sidewall of a bottom portion of the core structure, wherein a top surface of the first pattern is lower than a top surface of the core structure; and
   a second pattern disposed on the first pattern and covering a top portion of the core structure,
   wherein a sidewall of the top portion of the core structure and the top surface of the core structure are covered by the second pattern,
   wherein the second pattern has an upper portion tapered away from the substrate,
   wherein a material of the first pattern is different from a material of the second pattern, and
   wherein a bottommost surface of the second pattern is completely in contact with a top surface of the first pattern, and is inclined, such that an extending direction of the bottommost surface of the second pattern is intersected with an extending direction of a top surface of the substrate.

11. The semiconductor device according to claim 10, wherein a sidewall of a lower portion of the second pattern is coplanar with an outer surface of the first pattern, and the lower portion of the second pattern spans from a bottommost end of the upper portion to the bottommost surface of the second pattern.

* * * * *